US008638558B2

(12) United States Patent  
Takada et al.

(10) Patent No.: US 8,638,558 B2  
(45) Date of Patent: Jan. 28, 2014

(54) ELECTRONIC UNIT, ELECTRONIC SYSTEM, AND CONTAINING DEVICE

(75) Inventors: Hideyo Takada, Kawasaki (JP); Shingo Ochiai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 244 days.

(21) Appl. No.: 13/239,567

(22) Filed: Sep. 22, 2011

(65) Prior Publication Data

US 2012/0008281 A1     Jan. 12, 2012

Related U.S. Application Data

(63) Continuation of application No. PCT/JP2009/060002, filed on Jun. 1, 2009.

(51) Int. Cl.
*H05K 7/20* (2006.01)
*B65D 85/00* (2006.01)

(52) U.S. Cl.
USPC ............. 361/695; 361/679.46; 361/679.48; 361/679.49; 361/690; 361/694; 165/80.2; 165/104.33; 165/121; 165/122; 454/184

(58) Field of Classification Search
USPC ......... 361/679.46–679.5, 690–697, 715–728; 165/80.2, 80.3, 80.4, 104.33, 104.34, 165/121–126, 185; 454/184; 312/223.2, 312/223.3, 236, 265; 175/50, 50.52, 17 VA, 175/35 R, 35 MS; 713/300, 320; 710/302, 710/320, 301, 10, 15; 200/50.02, 50.03, 200/50.1, 16 D, 334
See application file for complete search history.

(56) References Cited

U.S. PATENT DOCUMENTS

| | | | | |
|---|---|---|---|---|
| 3,932,716 A | * | 1/1976 | Mottel et al. | 200/50.02 |
| 4,792,650 A | * | 12/1988 | Iwai | 200/50.03 |
| 5,103,374 A | | 4/1992 | Azar | |
| 5,317,477 A | * | 5/1994 | Gillett | 361/679.39 |
| 6,687,837 B1 | * | 2/2004 | Beck | 713/300 |
| 6,718,472 B1 | * | 4/2004 | Garnett | 713/300 |
| 6,771,499 B2 | * | 8/2004 | Crippen | 361/679.48 |
| 7,132,763 B2 | * | 11/2006 | Rendic | 307/31 |
| 7,263,569 B1 | * | 8/2007 | Sardella et al. | 710/302 |
| 7,484,111 B2 | * | 1/2009 | Fung | 713/320 |
| 2007/0081308 A1 | * | 4/2007 | Ishida | 361/724 |
| 2007/0264860 A1 | | 11/2007 | Iwasaki et al. | |

FOREIGN PATENT DOCUMENTS

| | | |
|---|---|---|
| JP | 4-229697 | 8/1992 |
| JP | 10-161865 | 6/1998 |
| JP | 11-110886 | 4/1999 |
| JP | 2002-261477 | 9/2002 |

(Continued)

OTHER PUBLICATIONS

International Search Report for PCT/JP2009/060002, mailed Aug. 25, 2009.

*Primary Examiner* — Michail V Datskovskiy
(74) *Attorney, Agent, or Firm* — Staas & Halsey LLP (57) ABSTRACT

In an electronic unit accommodated in a containing device so as to be adjacent to another electronic unit accommodated in the containing device, the electronic unit includes: a housing that is formed into a tub shape, that is provided with a plate comprising an air blowing hole, and that is closed by said another electronic unit when the electronic unit and the other electronic unit are accommodated in the containing device; and an interrupting portion that interrupts power supply to the electronic unit when said another electronic unit is detached from the containing device and the housing of the electronic unit is opened.

4 Claims, 7 Drawing Sheets

(56) References Cited

FOREIGN PATENT DOCUMENTS

| JP | 2002-366258 | | 12/2002 | |
| JP | 03216283 A | * | 7/2003 | ............... G06F 1/26 |
| JP | 2005-202622 | | 7/2005 | |
| JP | 2006-216594 | | 8/2006 | |
| WO | 2006/080070 A1 | | 8/2006 | |

* cited by examiner

ELECTRONIC UNIT, ELECTRONIC SYSTEM, AND CONTAINING DEVICE

CROSS-REFERENCE TO RELATED APPLICATIONS

This application is a continuation application of PCT/JP2009/060002, filed on Jun. 1, 2009, the entire contents of which are incorporated herein by reference.

FIELD

The embodiments discussed herein are related to an electronic unit, an electronic system, and a containing device.

BACKGROUND

There is known an electronic system including plural electronic units and a containing device accommodating the plural electronic units. A related art is disclosed in Japanese Laid-open Patent Publication No. 2006-216594. The electronic unit includes an electronic part reaching a high temperature. There is known a technique in which air is blown into a housing of the electronic unit in order to assist the electronic part in dissipating heat. Such a housing includes a side plate having air blowing holes.

The housing of the electronic unit is partially reduced, thereby reducing a weight of the electronic unit. However, the reduction might disturb a cooling air blowing into the housing of the electronic unit to reduce the cooling capacity, thereby increasing the temperature of the electronic unit.

SUMMARY

According to an aspect of the embodiments, in an electronic unit accommodated in a containing device so as to be adjacent to another electronic unit accommodated in the containing device, the electronic unit includes: a housing that is formed into a tub shape, that is provided with a plate comprising an air blowing hole, and that is closed by said another electronic unit when the electronic unit and the other electronic unit are accommodated in the containing device; and an interrupting portion that interrupts power supply to the electronic unit when said another electronic unit is detached from the containing device and the housing of the electronic unit is opened.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments will be described with reference to the drawings.

[First Embodiment]

FIGS. 1A to 1D are illustrations describing an electronic system according to a first embodiment. The electronic system according to the first embodiment includes: plural blade severs (hereinafter, referred to as servers) 10; and a chassis 100 for accommodating the plural servers 10. The server 10 is an example of an electronic unit. The chassis 100 is an example of a containing device. The electronic system according to the first embodiment functions as a server computer.

Figure 1A:
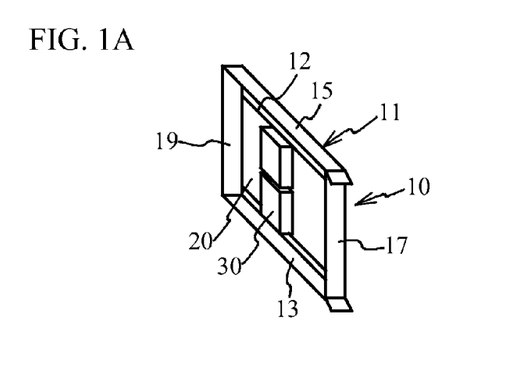
FIGS. 1A to 1D are illustrations describing an electronic system according to a first embodiment.

The server 10 includes a housing 11 having a tub shape as illustrated in FIG. 1A. The housing 11 is made of metal. The housing 11 includes: a bottom plate 12; side plates 13 and 15; a front plate 17; and a rear plate 19. A printed circuit board 20 is held within the housing 11. The printed circuit board 20 is arranged in parallel with the bottom plate 12. Plural electronic parts 30 are mounted on the printed circuit board 20. Each of the front plate 17 and the rear plate 19 is partially formed into a mesh shape to be provided with plural air blowing holes, as will be described later in detail. The housing 11 does not have a top plate that is arranged to face the bottom plate 12. A general blade server is provided with a top plate. The housing 11 of the server 10 does not have a top plate, thereby reducing its weight. Further, it is easy to check the inside of the server 10.

Figure 1B:
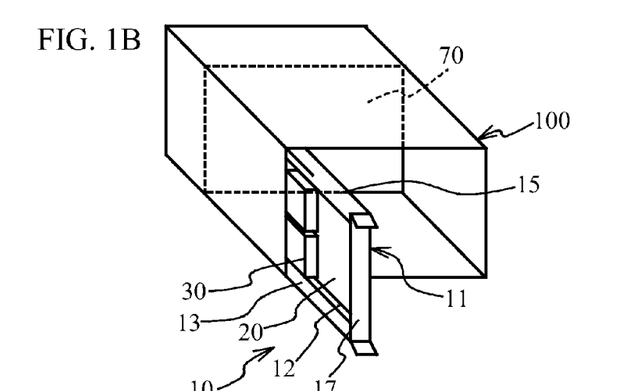
Figure 1C:
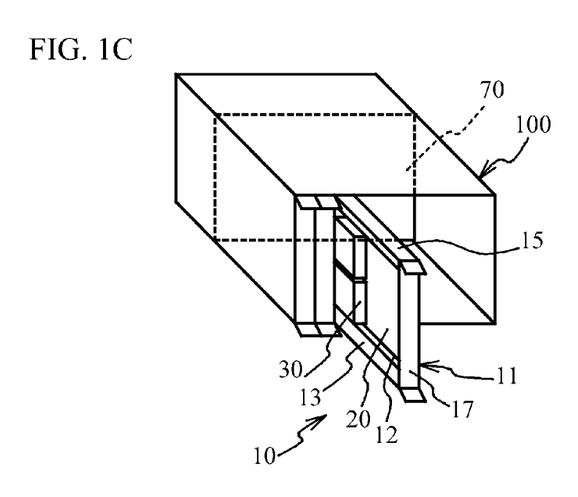

A mid plane 70 is arranged within the chassis 100 as illustrated in FIG. 1B. The mid plane 70 is a rigid printed circuit board that is provided with wiring patterns. The server 10 and the mid plane 70 are electrically connected to each other via a connector. The plural servers 10 are aligned to be accommodated within the chassis 100 as illustrated in FIG. 1C. The server 10 accommodated at one end of the chassis 100 is closed by a wall of the chassis 100 as illustrated in FIG. 1B. Further, in the state where the plural servers 10 are accommodated in the chassis 100, the server 10 is closed by the housing 11 of another server 10 adjacent thereto as illustrated in FIG. 1C. Additionally, the chassis 100 is provided at its inside with guide rails for holding attachably and detachably the server 10.

Figure 1D:
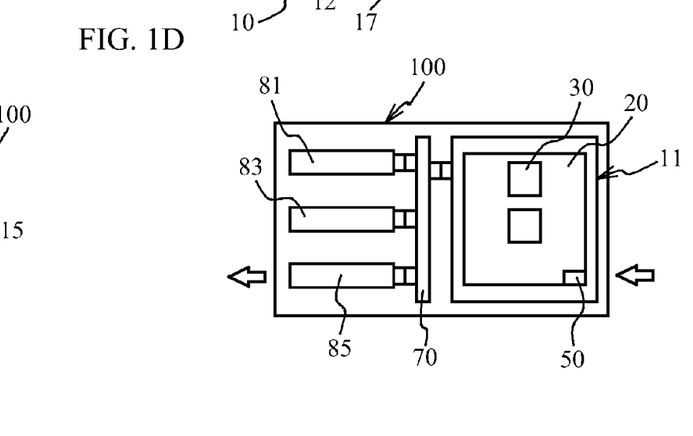

FIG. 1D illustrates an internal structure of the electronic system where the server 10 is accommodated in the chassis 100. The server 10 is connected to the front side of the chassis 100 via a connector. A power supply unit 81, a switch unit 83, and a fan unit 85 are connected to the rear side of the chassis 100 via connectors, respectively. The fan unit 85 blows air in a direction of an arrow illustrated in FIG. 1D. The fan unit 85 is provided for preventing the servers 10 from having high temperatures. The fan unit 85 blows air from the front side to the rear side of the server 10. Further, as mentioned above, air can blows through the front plate 17 and the rear plate 19 of the housing 11, whereby the cooling air blows through the housing 11. Additionally, the server 10 is provided with a detection switch 50 as will be described later in detail.

As mentioned above, the housing 11 has a tub shape and does not have a top plate in order to reduce the weight of the server 10. In such a case where a top plate is not provided, the cooling air blowing through the housing 11 might be distorted to reduce the cooling capacity for cooling the 30 within the housing 11. However, as illustrated in FIG. 1C, when the plural servers 10 are accommodated, the server 10 is closed by the housing 11 of adjacent another server 10. In other words, the bottom plate 12 of the housing 11 of the adjacent other server 10 functions as a top plate of the housing 11 of the server 10. Thus, the plural servers 10 are accommodated in the chassis 100, thereby preventing the cooling air from being distorted and suppressing the cooling capacity from being reduced. This also reduces the weight of the whole electronic system.

Figure 2A:
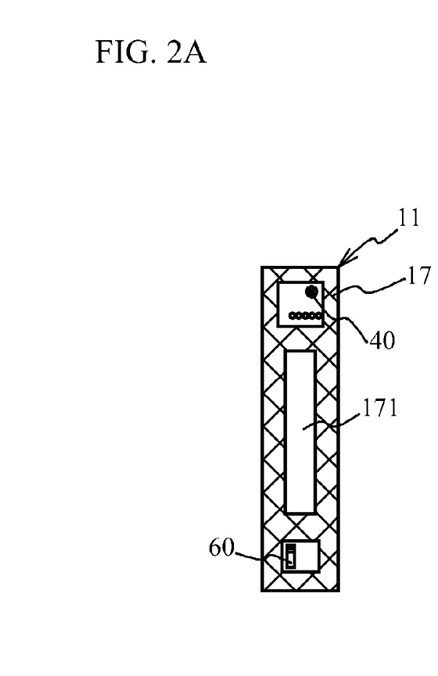
FIG. 2A illustrates a front view of a server.

Next, plural switches provided in the server 10 will be described. FIG. 2A illustrates a front view of the server 10. The front plate 17 is formed with an insertion slot 171. For example, a storage medium such as a hard disk is insertable into the insertion slot 171. The front plate 17 is provided with a main switch 40 for switching the power supply to the server 10. The front plate 17 is provided with a sub switch 60 as will be described later. The sub switch 60 is mainly used for maintenance.

Figure 2B:
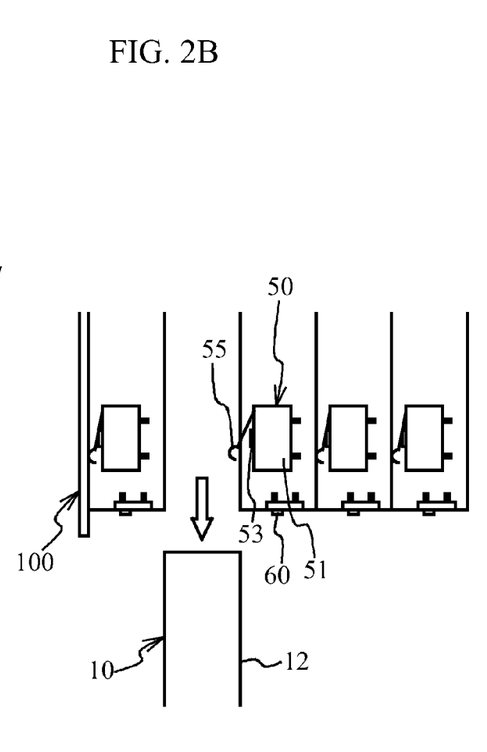
FIG. 2B illustrates a state where plural servers are accommodated in a chassis.

FIG. 2B illustrates a state where the plural servers 10 are accommodated in the chassis 100. The servers 10 are provided with detection switches 50, respectively. The detection switch 50 has a function to detect another server 10 adjacent thereto.

Figure 2C:
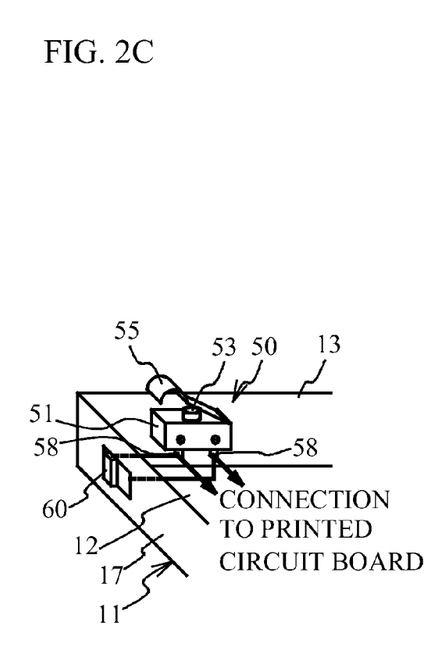
FIG. 2C illustrates an enlarged view around a detection switch.

FIG. 2C illustrates an enlarged view around the detection switch 50. The detection switch 50 includes: a body portion 51; a button 53; a pushed piece 55; and terminals 58. The body portion 51 is secured at the inside of the side plate 13. The button 53 is provided at the body portion 51 and is capable of being pushed. The pushed piece 55 is coupled to the body portion 51 to shift between a standing state and a lying state. The pushed piece 55 is thin and made of metal. The pushed piece 55 has an end portion with a curve shape. When the pushed piece 55 is in the lying state, the button 53 is pushed by the pushed piece 55. The pushed piece 55 is pushed by the housing 11 of the adjacent other server 10 to be in the lying state, thereby pushing the button 53. The button 53 is pushed to turn on the detection switch 50. The terminals 58 are electrically connected to a wiring pattern formed in the printed circuit board 20 omitted in FIG. 2C. Further, the sub switch 60 and the terminals 58 are electrically connected to each other via the printed circuit board 20.

As illustrated in FIG. 2B, the adjacent other server 10 causes the pushed piece 55 to be in the lying state to push the button 53, thereby turning on the detection switch 50. In contrast, when there is no adjacent other server 10, the pushed piece 55 is in the standing state not to push the button 53, thereby turning off the detection switch 50. In such a way, the detection switch 50 can detect the existence of the adjacent other server 10. When the detection switch 50 is turned off, the power supply to the server 10 is interrupted except for a case as will be described later. The detection switch 50 is an example of an interrupting portion.

Figure 3A:
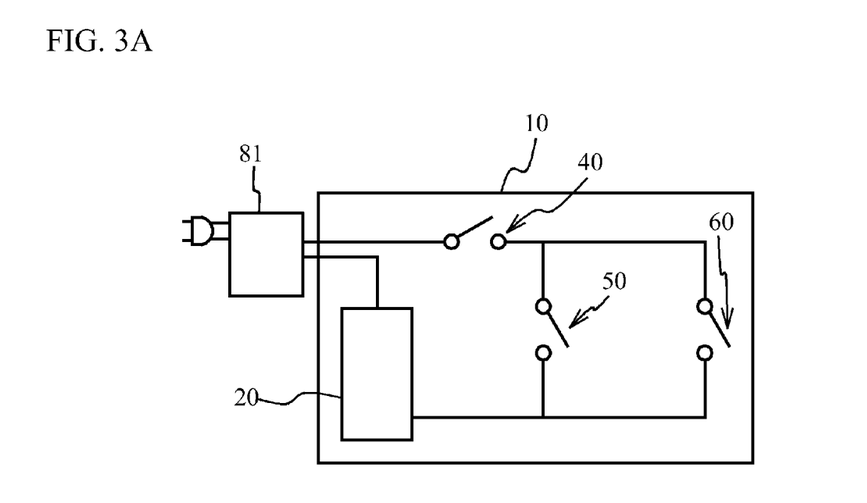
FIGS. 3A and 3B schematically illustrate the servers.
Figure 3B:
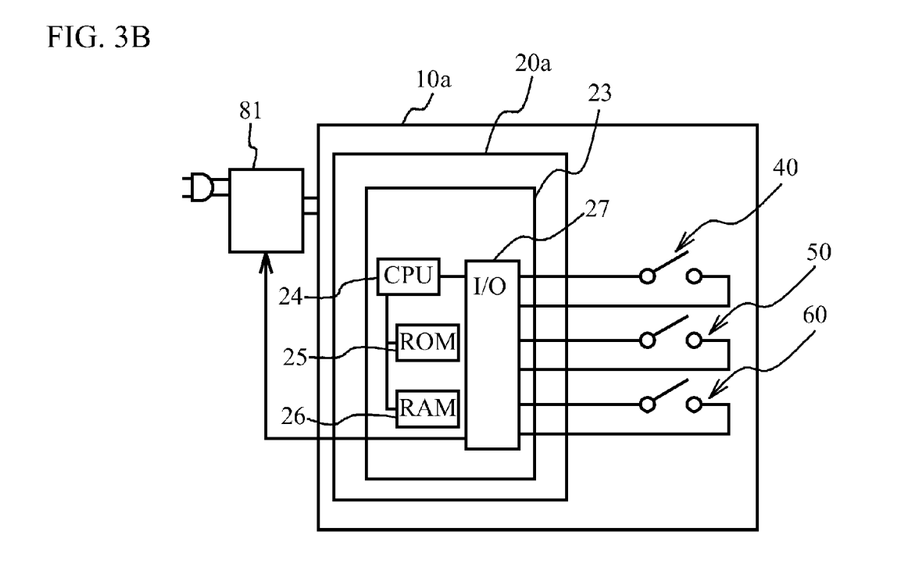

Next, a power supply path in the server 10 will be described. FIGS. 3A and 3B schematically illustrate the servers. As illustrated FIG. 3A, the power supply unit 81 and the printed circuit board 20 are electrically connected to the each other via the main switch 40, the detection switch 50, and the sub switch 60. The detection switch 50 and the sub switch 60 are connected in parallel to each other. The main switch 40 and the detection switch 50 or the sub switch 60 are connected in series to each other. By switching the main switch 40, the power supply to the printed circuit board 20 from the power supply unit 81 is ensured or interrupted. In contrast, even when the main switch 40 is turned on and both the detection switch 50 and the sub switch 60 are turned off, the power supply to the printed circuit board 20 is interrupted.

When the adjacent other server 10 is detached from the chassis 100 and the sub switch 60 is turned off, the detection switch 50 is caused to be turned off to interrupt the power supply to the printed circuit board 20. When the adjacent other sever 10 is detached, the cooling air is distorted to reduce the cooling capacity for cooling the servers 10, since the housing 11 of the server 10 does not have a top plate. Therefore, in this case, the detection switch 50 of the server 10 is turned off to interrupt the power supply. Accordingly, the server 10 is prevented from having a high temperature.

Additionally, it may be assumed that the power supply to the accommodated server 10 should be maintained even when the adjacent other server 10 is detached. This case is a case where the server 10 is temporarily detached, for maintenance. In such a case, the sub switch 60 is turned on to maintain the power supply to the accommodated server 10, even when the adjacent other sever 10 is detached.

Next, a description will be given of cases where the power supply is controlled by a processor. As illustrated in FIG. 3B, a processor 23 is mounted on a printed circuit board 20a of a server 10a. The processor 23 includes a Central processing Unit (CPU) 24, a Read Only Memory (ROM) 25, a Random Access Memory (RAM) 26, and an Input/Output (I/O) 27. The I/O 27 is connected to the main switch 40, the detection switch 50, and the sub switch 60. The processor 23 controls the power supply from the power supply unit 81 to the printed circuit board 20a based on signals from the main switch 40, the detection switch 50, and the sub switch 60.

Figure 4A:
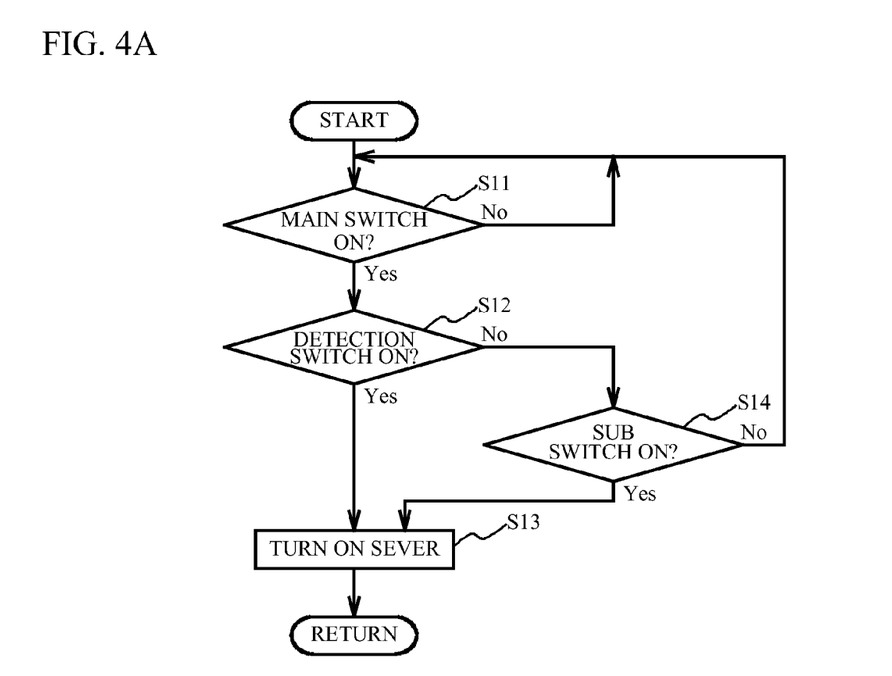
FIGS. 4A and 4B are flowcharts of processes executed by a processor.
Figure 4B:
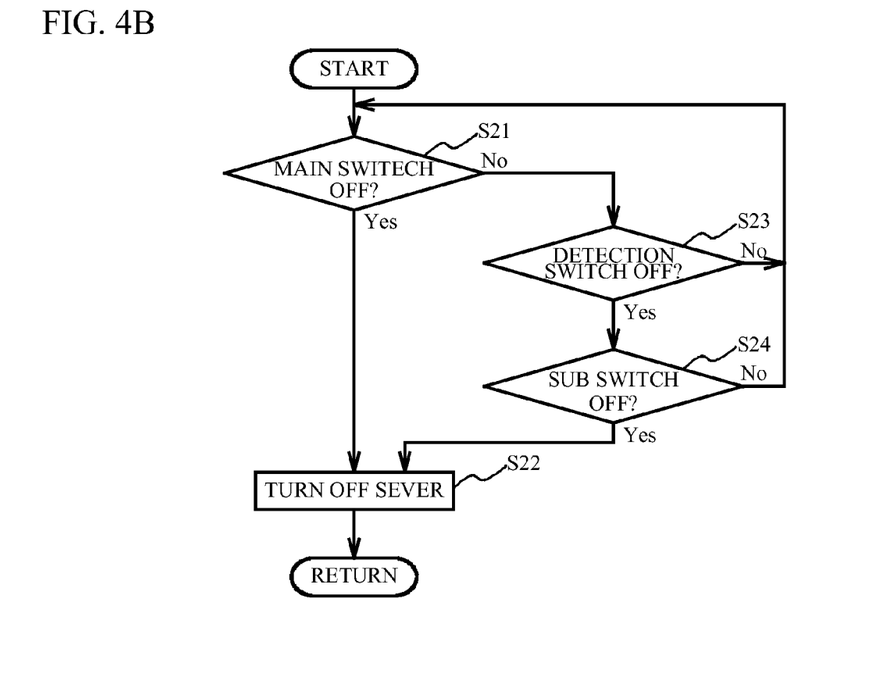

A description will be given of processes executed by the processor 23 illustrated in FIG. 3B. FIGS. 4A and 4B are flowcharts of processes executed by the processor 23. First, a description will be given of a control for switching from the state where the power supply to the server 10 is interrupted to the state where the power is supplied to the server 10.

As illustrated in FIG. 4, the processor 23 determines whether or not the main switch 40 is on (step S11), and continues detecting the state of the main switch 40 until the main switch 40 is on. When the main switch 40 is on, the processor 23 determines whether or not the detection switch 50 is on (step S12). When the detection switch 50 is on, the power is supplied to the printed circuit board 20a to turn on the server 10 (step S13).

When the detection switch 50 is off, the processor 23 determines whether or not the sub switch 60 is on (step S14). When the sub switch 60 is off, the processor 23 executes the process in step S23 again. When the sub switch 60 is on, the processor 23 turns on the server 10 (step S13). In such a way, although the detection switch 50 is off, when the sub switch 60 is on, the processor 23 turns on the server 10. Therefore, for example, in maintenance, the sub switch 60 is turned on to prevent the server 10 from stopping.

Next, a description will be given of a control for switching from the state where the power is supplied to the server 10 to the state where the power supply to the server 10 is interrupted. As illustrated in FIG. 4B, the processor 23 determines whether or not the main switch 40 is off (step S21). Additionally, the main switch 40 is switched between on and off by a user's hand. When the main switch 40 is off, the processor 23 shuts off the power supply to the server 10 (step S22). When the main switch 40 is on, the processor 23 determines whether or not the detection switch 50 is off (step S23).

When the detection switch 50 is on, the processor 23 executes the process in step S21 again. When the detection switch 50 is off, the processor 23 determines whether or not the sub switch 60 is off (step S24). When the sub switch 60 is on, the processor 23 executes the process in step S23 again. When the sub switch 60 is off, the processor 23 shuts off the power supply to the server 10 (step S22). In such a way, when the main switch 40 is on and both the detection switch 50 and the sub switch 60 are off, the power supply to the server 10 is interrupted.

Figure 5:
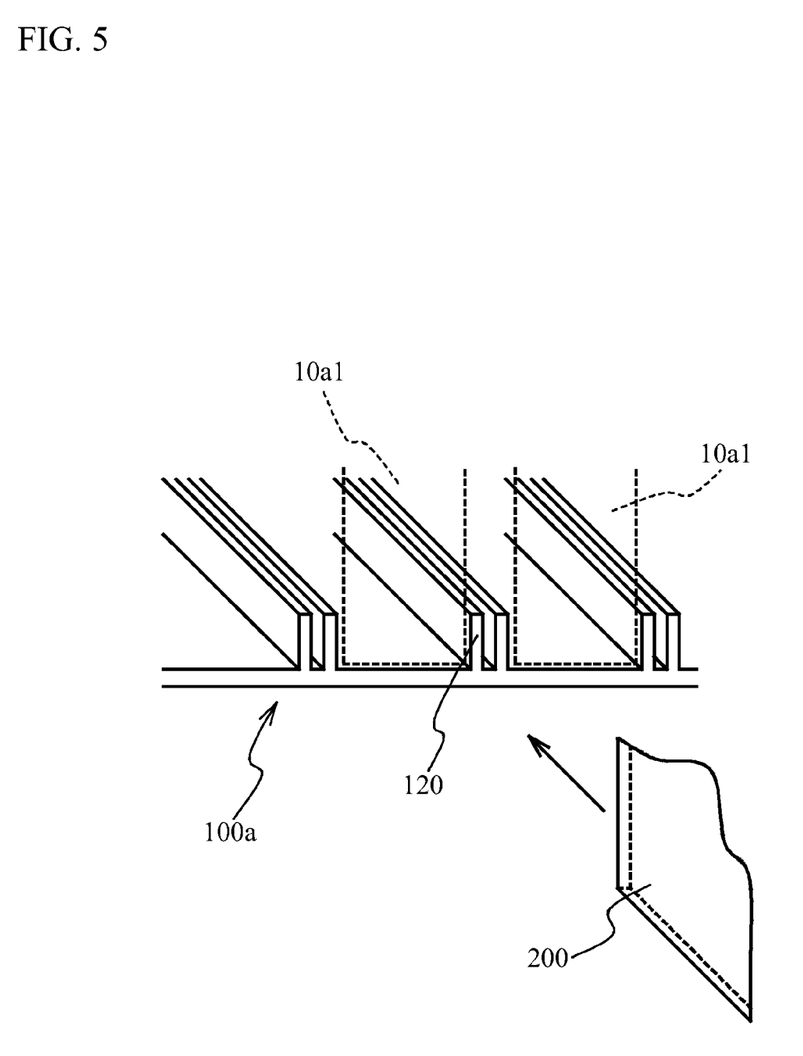
FIG. 5 is an illustration describing a variation of the chassis.

Next, a variation of the chassis will be described. FIG. 5 is an illustration describing the variation of the chassis. Plural holding portions 120 are provided at the inner side of a wall portion of a chassis 100a. The holding portion 120 is formed into a groove shape into and from which an air flowing guide 200 is capable of being inserted and pulled. Further, a server 10a1 is accommodated between the holding portion 120. Unlike the above severs 10 and 10a, the server 10a1 is not provided with the sub switch 60. When the adjacent other sever 10a1 is detached from the chassis 100a, the detection switch 50 of the accommodated server 10a1 is turned off to interrupt the power supply. However, the air flowing guide 200 is inserted into the holding portion 120 beforehand, whereby the detection switch 50 is maintained in the on state by the air flowing guide 200 even when the adjacent other sever 10a1 is detached. In such a way, the power supply to the server 10a1 is prevented from being interrupted. For example, in maintenance, the air flowing guide 200 is inserted into the holding portion 120 beforehand, whereby the power supply to the server 10a1 is prevented from being interrupted.

[Second Embodiment]

Figure 6:
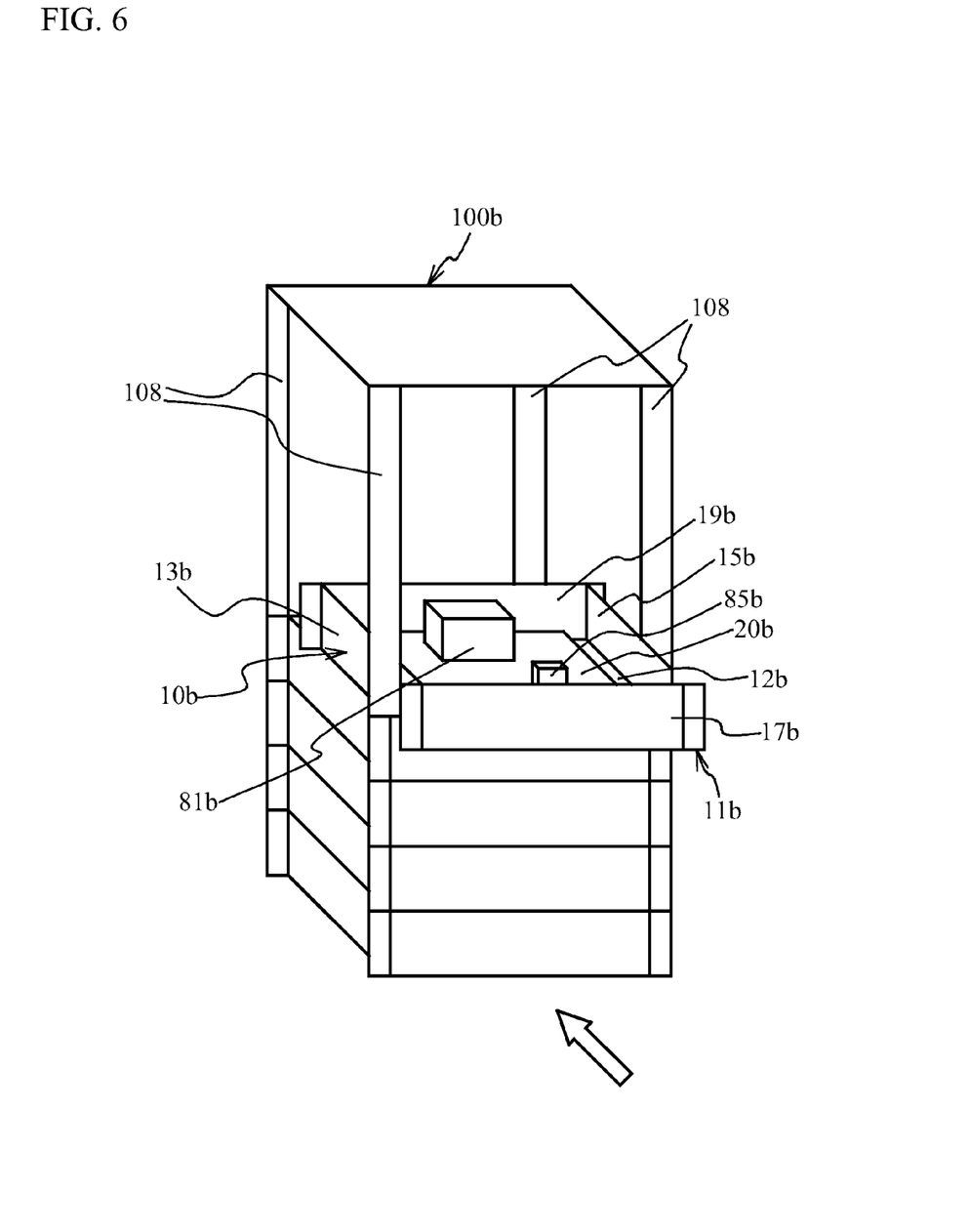
FIG. 6 is an illustration describing an electronic system according to a second embodiment.

Next, an electronic system according to a second embodiment will be described. FIG. 6 is an illustration describing the electronic system according to the second embodiment. The electronic system according to the second embodiment includes: plural rack mount servers (hereinafter, referred to as serves) 10b; and a rack 100b accommodating the servers 10b. The rack 100b has four pillars 108. Additionally, each of right pillars 108 and left pillars 108 are secured with guide rails for assisting the attachment of the serves 10b. Like the above mentioned sever 10, the server 10b has a housing 11b with a tub shape. A power supply unit 81b and a fan unit 85b are mounted on a printed circuit board 20b. That is, the server 10b is equipped with the power supply unit 81b and the printed circuit board 20b. Like the above mentioned sever 10, the server 10b is provided with the detection switch 50 and the sub switch 60.

When the plural servers 10b are accommodated in the rack 100b, the server 10b is closed by the housing 11b of the adjacent other server 10b. Thus, this electronic system has the same effect as the above mentioned electronic system.

Figure 7A:
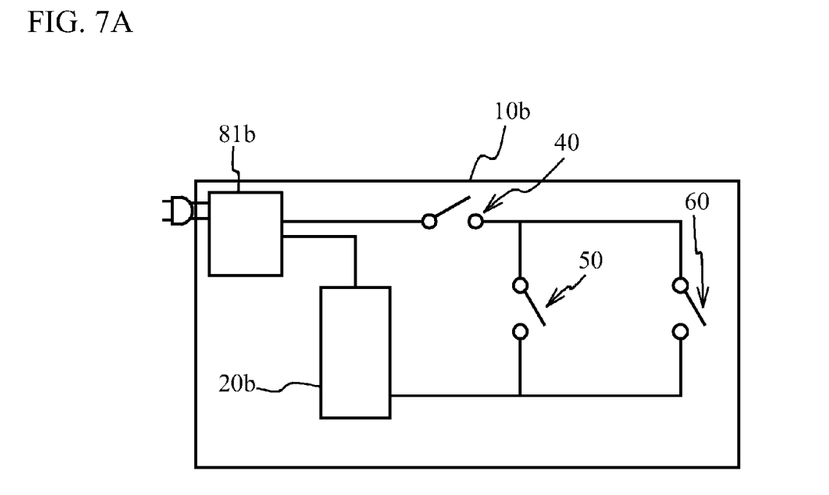
FIGS. 7A and 7B schematically illustrate the servers.
Figure 7B:
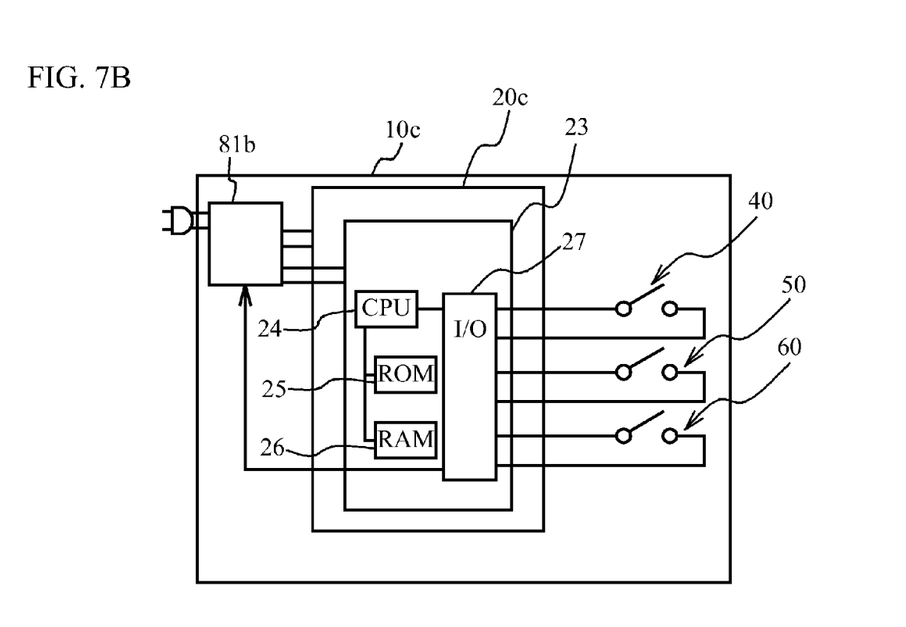

Next, a path of the power supply to the server 10b will be described. FIGS. 7A and 7B schematically illustrates the servers. As illustrated in FIG. 7A, the server 10b is provided with the power supply unit 81b. The main switch 40, the detection switch 50, and the sub switch 60 each have the same function as the above server 10. As illustrated in FIG. 7B, the processor 23 of a server 10c have the same function as the processor 23 of the above mentioned server 10. As described heretofore, the electronic system according to the second embodiment has the same function as the electronic system according to the first embodiment.

In the above embodiment, the detection switch 50 detects the existence of the adjacent server 10 in accordance with the physical contact of the detection switch 50 with the adjacent serve 10. However, the present invention is not limited to these arrangements. For example, an optical sensor including a light emitting element and a light receiving element may detect the existence of the adjacent other sever 10.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. An electronic unit accommodated in a containing device so as to be adjacent to another electronic unit accommodated in the containing device, the electronic unit comprising:
   a housing that is formed into a tub shape, that is provided with a plate comprising an air blowing hole, and that is closed by said another electronic unit when the electronic unit and the other electronic unit are accommodated in the containing device; and
   an interrupting portion that interrupts power supply to the electronic unit when said another electronic unit is detached from the containing device and the housing of the electronic unit is opened.

2. The electronic unit of claim 1 wherein the interrupting portion comprises a switch that is pushed by the other electronic unit to be turned on when the electronic unit and said another electronic unit are accommodated in the containing device and, that is turned off when said another electronic unit is detached from the containing device.

3. The electronic unit of claim 1, further comprising a sub switch that ensures the power supply to the electronic unit regardless of the power supply being interrupted by the interrupting portion.

4. An electronic system comprising:
   a containing device; and
   an electronic unit that is accommodated in the containing device so as to be adjacent to another electronic unit accommodated in the containing device,
   wherein the electronic unit comprises:
      a housing that is formed into a tub shape, that is provided with a plate comprising an air blowing hole, and that is closed by said another electronic unit when the electronic unit and the other electronic unit are accommodated in the containing device; and
      an interrupting portion that interrupts power supply to the electronic unit when said another electronic unit is detached from the containing device and the housing of the electronic unit is opened.

* * * * *